United States Patent [19]

Pellerin

[11] Patent Number: 4,873,689

[45] Date of Patent: Oct. 10, 1989

[54] METHOD AND APPARATUS FOR COLLECTING ERRORS IN THE DIGITAL DATA OF A TELEVISION SIGNAL

[75] Inventor: Daniel Pellerin, Versailles, France

[73] Assignee: U.S. Philips Corporation, New York, N.Y.

[21] Appl. No.: 203,405

[22] Filed: Jun. 6, 1988

[30] Foreign Application Priority Data

Jun. 16, 1987 [FR] France .................. 87 08370

[51] Int. Cl.⁴ .............................................. G06F 11/00
[52] U.S. Cl. .................................... 371/37.1; 371/38.1
[58] Field of Search ................... 371/37, 38, 39, 40, 371/41, 5; 370/94

[56] References Cited

U.S. PATENT DOCUMENTS

| | | | |
|---|---|---|---|
| 4,397,022 | 8/1983 | Weng | 371/41 |
| 4,414,667 | 11/1983 | Bennett | 371/39 |
| 4,613,860 | 9/1986 | Currie | 371/37 |
| 4,648,091 | 3/1987 | Gajjar | 371/37 |
| 4,757,498 | 7/1988 | Murray | 370/94 |

*Primary Examiner*—Michael R. Fleming
*Attorney, Agent, or Firm*—Michael E. Marion

[57] ABSTRACT

A method and apparatus for correcting errors in the digital data of a television signal, wherein the digital signals are Golay codes having 23 bits constituted by two parts: a message and a redundance. If there are between zero and three errors to be corrected, there are 2048 possible cases, whose examination one by one would be too time-consuming and/or too expensive in a memory. However, if there are two errors in one of the parts, there cannot be more than one error in the other part. Therefore, in a first case, one of the parts does not comprise errors and serves to recreate the other part (1-8) completely. In the other case, one of the parts comprises only one error: there is started from this part; the different bits susceptible to being affected by the single error thereof are modified in turn (9,12) and there is each tiem verified (10,13,15) whether the other part could correspond to the modified part. The total number of tests is thus strongly limited.

5 Claims, 2 Drawing Sheets $$G = \begin{vmatrix} 1 & 0 & 1 & 0 & 0 & 1 & 0 & 0 & 1 & 1 & 1 & 1 \\ 1 & 1 & 1 & 1 & 0 & 1 & 1 & 0 & 1 & 0 & 0 & 0 \\ 0 & 1 & 1 & 1 & 1 & 0 & 1 & 1 & 0 & 1 & 0 & 0 \\ 0 & 0 & 1 & 1 & 1 & 1 & 0 & 1 & 1 & 0 & 1 & 0 \\ 0 & 0 & 0 & 1 & 1 & 1 & 1 & 0 & 1 & 1 & 0 & 1 \\ 1 & 0 & 1 & 0 & 1 & 0 & 1 & 1 & 1 & 0 & 0 & 1 \\ 1 & 1 & 1 & 1 & 0 & 0 & 0 & 1 & 0 & 0 & 1 & 1 \\ 1 & 1 & 0 & 1 & 1 & 0 & 0 & 0 & 1 & 1 & 1 & 0 \\ 0 & 1 & 1 & 0 & 1 & 1 & 0 & 0 & 0 & 1 & 1 & 1 \\ 1 & 0 & 0 & 1 & 0 & 0 & 1 & 1 & 1 & 1 & 1 & 0 \\ 0 & 1 & 0 & 0 & 1 & 0 & 0 & 1 & 1 & 1 & 1 & 1 \end{vmatrix}$$

FIG.1

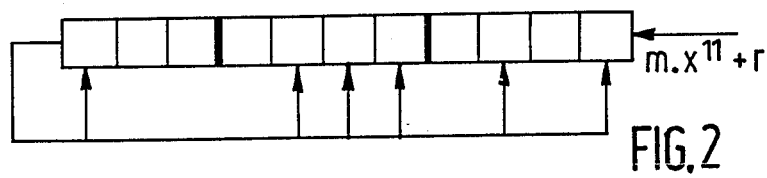

FIG.2

$$M = \begin{vmatrix} 1 & 1 & 0 & 0 & 0 & 1 & 1 & 0 & 1 & 0 \\ 0 & 1 & 1 & 0 & 0 & 0 & 1 & 1 & 0 & 1 \\ 1 & 1 & 1 & 0 & 1 & 1 & 0 & 1 & 0 & 0 \\ 0 & 1 & 1 & 1 & 0 & 1 & 1 & 0 & 1 & 0 \\ 0 & 0 & 1 & 1 & 1 & 0 & 1 & 1 & 0 & 1 \\ 1 & 1 & 0 & 1 & 1 & 0 & 0 & 1 & 1 & 0 & 0 \\ 0 & 1 & 1 & 0 & 1 & 1 & 0 & 0 & 1 & 1 & 0 \\ 0 & 0 & 1 & 1 & 0 & 1 & 1 & 0 & 0 & 1 & 1 \\ 1 & 1 & 0 & 1 & 1 & 1 & 0 & 0 & 0 & 1 & 1 \\ 1 & 0 & 1 & 0 & 1 & 0 & 0 & 1 & 0 & 1 & 1 \\ 1 & 0 & 0 & 1 & 0 & 0 & 1 & 1 & 1 & 1 \\ 1 & 0 & 0 & 0 & 1 & 1 & 1 & 0 & 1 & 1 \end{vmatrix}$$

FIG.3

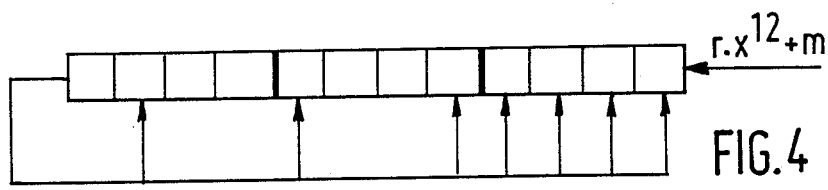

FIG.4

METHOD AND APPARATUS FOR COLLECTING ERRORS IN THE DIGITAL DATA OF A TELEVISION SIGNAL

BACKGROUND OF THE INVENTION

The invention relates to a method of correcting in a television receiver errors in a digital data signal received with the television signal, the number of errors being less than four.

The method according to the invention is applied especially applicable to receivers for use in a MAC system.

The digital data were transmitted after being subjected to a specific encoding: They are obtained at the transmitter-side by determining for each message to be transmitted, and which in this case comprises 12 bits, an associated so-called "redundancy" word. This redundancy word comprises 11 bits. Moreover, this 11 bits word is the residue of the Euclidian devision of the message by a word designated generating polynomial, and whih supplies a so-called "Golay" code. This code is cyclic, that is to say that any circular permutation of the bits of a complete code of the field assembly of codes supplies a new code, which is an element of the field. In addition, the code is such that for two messages differing from each other by only one single bit the redundancy words obtained therefrom always differ from each other by more than two bits, that is to say that two complete codes for two distinct messages always differ from each other by more than three bits.

At the reception side, a socalled "syndrome" code is generated from the received code. This syndrome code represents the difference between the redundancy code as received and that corresponding to the message received.

The theory of the Golay codes indicates that only under the condition that during transmission not more than three errors have been introduced, the initial message can always be retrieved and that moreover, if the syndrome does not comprise more than three bits, the errors are all present in the redundancy code, in which event not a single correction is necessary in the message.

However, it happens that the errors are distributed between the message and the redundancy code. In this case, the syndrome code comprises more than three bits. Several tactics can then be utilized. It can be deemed sufficient to note that the message is in error and there can be waited until it is subsequently repeated; should the case arise, also all the possible cases of distribution of 1 error bit in the 23 bits of the code can be examined, which represents 23 cases, then all the cases with 2 error bits, i.e. (23×22)/2 cases, and thereafter all the cases with 3 errors bits, i.e. (23×22×21)/3×2) cases, i.e. 2048 cases in all, whilst taking into account the case in which there are no errors, and the cases are systematically examined one by one unitl the correct one is found. However, such a treatment, which has to be effected at the speed of arrival of the codes, requires a substantial calculation capacity.

SUMMARY OF THE INVENTION

The invention has for its object to provide a method of correcting errors, which examines exhaustively all the cases of errors that can be corrected and is nevertheless rapid and inexpensive in storage capacity, and an apparatus for carrying out this method.

The method according to the invention is especially characterized in that, if the syndrome code comprises more than three bits, a series of operations are carried out, each of which can provide the solution, in which event the following operations are not carried out, and which consists of the following tests:

From the redundancy word received, for which there are two corresponding messages capable of forming with it a correct code, it is determined for each of the two corresponding message words whether it differs by more than three bits from the message word received, in which event this corresponding word is the correct one;

each of the twelve bits of the message word received is modified in turn and each time it is determined whether the syndrome code of the complete code received provided with the modified message comprises more than two bits, in which event the modified message word received is the correct one;

each of the bits of the redundance word received is modified in turn and it is determined each time by each of the two corresponding message words whether it differs by more than two bits from the message word received, in which event this corresponding message word is the correct one.

An advantageous apparatus for carrying out the invention comprises for the calculation of the syndrome code a shift register or an equivalent digital device with a feedback from the output to the positions of the register corresponding to the terms present in the generating polynomial, the feedback having the effect to place in the said positions the result of the addition as "exclusive OR" function of the outgoing bit with the bit initially present in the said position.

In order to determine whether a message word corresponds to a redundance word, the apparatus moreover comprises advantageously a shift register or an equivalent digital device with a feedback to the bit positions corresponding to the hexadicimal number 49F.

For the calculation of the syndrome codes of the series of the modifed message words, the apparatus also comprises a memory, in which words are stored each corresponding to a column of a matrix generating the redundancy from the message, and a device for adding in turn each of the said words to the contents of the shift register, while it comprises, in order to determine whether a message word corresponds to one or the other of the series of the modified redundancy words, another memory, in which words are stored each corresponding to a column of a matrix generating the message from the redundancy code, and a device for adding in turn each of the said words to the contents of the shift register.

BRIEF DESCRIPTION OF THE DRAWINGS

In order that the invention may be readily carried out, it will now be described more fully, by way of example, with reference to the accompanying drawings, in which:

FIG. 1 shows a matrix which can be used for the calculation of the syndrome,

FIG. 2 shows a shift regitser, which is fed back and realizes a logic division that can be used for the calculation of the syndrome, FIG. 3 shows another matrix that can be used in the method, FIG. 4 shows another shift register, which is fed back and can be used in the method.

DETAILED DESCRIPTION OF THE INVENTION

Figure 5:
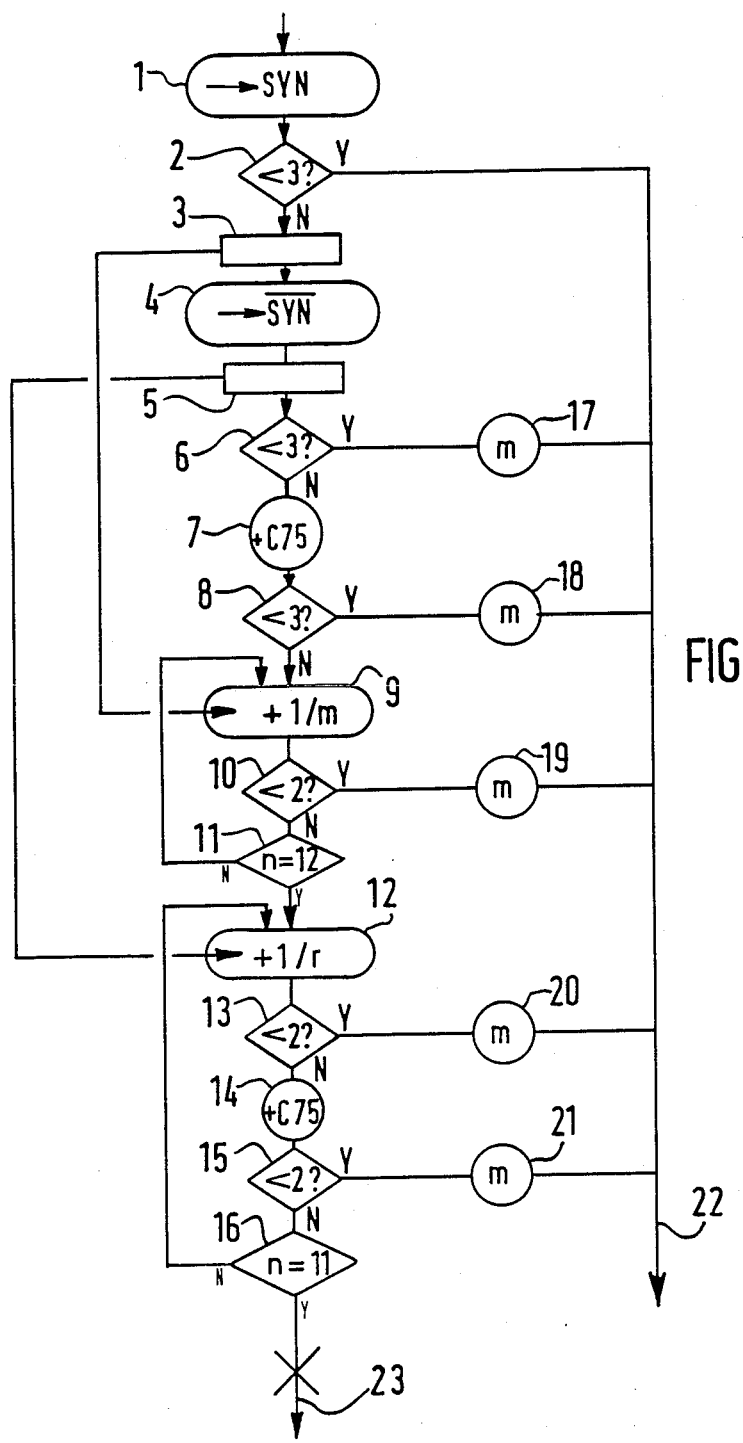
FIG. 5 shows a diagram illustrataing the whole of the method.

The method based on the Golay code permits of correcting errors only for at most three errors. It should therefore be noted that there can be three situations at the end of the method:

either the errors are found and the reconstructed message is correct;

or none of the tests contained in the method has been satisfied: it is known that the message cannot be retrieved;

or finally a correct message is believed to have been found, but in fact there were more than three errors and the message is really false: unfortunately there are no means to know whether this case is concerned and the method would therefore no longer be usable in very severe conditions, which are fortunately rare, however, in which the signal-to-noise ratio would be such that there is a serious probability that more than three errors per message are present. It should be noted that in such conditions the whole of the system would at any rate be unusable!

The Golay code comprising 23 bits is constituted by a message of 12 bits and by a redundance of 11 bits.

In order to define the operations to be carried out on these sequences of bits, it is favourable to use a mathematical representation known by a person skilled in the art as being related to the technical means permitting of executing the specified functions.

"m(x)" designates a polynome representing the message by a,b,c,d,e,f,g,h,i,j,k,l,m, (each term a,b, . . . m having a value 1 or 0):

$$m(x) = a\, x^{11} + b\, x^{10} + \ldots + 1x + m \quad \text{(12 terms)}$$

Such a polynome represents in practice a word in which each bit whose rank-order corresponds to a power of x has the value of the coefficencet (a,b, . . . m) which is associated in the polynome with this power of x.

"r(x)" designates a polynome representing the redundance by p,q,r,s,t,u,v,w,x,y,z:

$$r(x) = p\, x^{10} + q\, x^9 + \ldots + y\, x + z \quad \text{(11 terms)}$$

The mode of calculation of the redundance from the message is defined by means of the following relation:

$$m(x)^x x^{11} + r(x) = G(x)^x q(x) \quad (1),$$

where G(x) is a generating polynome. In the present case, this polynome is a first divide-by-$x^{23}+1$ polynome:

$$G(x) = x^{11} + x^{10} + x^6 + x^5 + x^4 + x^2 + 1.$$

This relation shows that r(x) can be considered as the residue of the Euclidian division of the $m(x)^x\, x^{11}$ by G(x), in which division the restraints are not taken into account (the additions or subtractions of bits are here always "Exclusive OR" functions and the multiplications are logic "AND" functions and q(x) is the quotient.

Instead of considering polynomes, an equivalent definition can be provided by means of a matrix method (either the method by division of polynomes or the matrix method according to the steps of the process, as will be described below, are used).

The message m and, the redundance R being considered as vectors:

$$m = (a,b,c, \ldots l,m)$$

$$r = (p,q,r, \ldots y,z)$$

r is thenobtaine dfrom m by the relation:

$$r = G^x m$$

where G is the matrix represented in FIG. 1. The $n^{th}$ bit of r is thus the scalar product of the $n^{th}$ line of G by m. The operators which correspond in the product to the multiplications and additions are "AND" and "Exclusive OR" functions, respectively.

Upon reception of a code m,r, the "syndrome" s(m,r) of the code can be calculated by:

$$s(m,r) = G^x m + r \quad (2)$$

where G is the matrix of FIG. 1.

The syndrome resulting from the bitwise addition ("Exclusive OR") of two terms of each 11 bits is also a word of 11 bits. It represents the difference between the redundance which would normally have to be associated with the message as received and the redundance really received. It is clear that, if there is not a single error, this difference is zero.

If to the message m(x) with its redundance r(x) are added errors that can be represented by m'(x) and r'(x), the received code therefore being m+m' associated with r+r', the syndrome calculated from the code received will be:

$$\begin{aligned} s(m + m', r + r') &= G^*(m + m') + r + r' \\ &= G^*m + r + G^*m' + r', \end{aligned}$$

in this expression $G^x m + r$ is zero, i.e. the syndrome of the code received is:

$$s(m+m', r+r') = G^x m' + r' \quad (3)$$

that is to say that the syndrome of the error bits which just have been added to the code.

A property of the Golay codes is that, if m' is not zero, $G^x m'$ contains more than three "1" bits. Therefore, conversely, if the syndrome contains less than three "1" bits, m'=0 and all the error bits are present in r'.

In the other cases, which are of interest here and in which there are errors in m, the syndrome contains 4 "1" bits or more, even if there is not a single error, but present in the message m.

It is not known how many errors are present, but the hypothesis is made a priori that there are at least three. This is the condition of validity of the method described below.

When there is at least one and there are at most three errors, four possible situations can be distinguished:

A-No errors in the message and one to three errors in the redundance;

B-One to three errors in the message and none in the redundance;

C-One error in the message and one or two errors in the redundance;

D-One or two errors in the message and only one error in the redundance.

The case A has already been mentioned above; it does not give rise to problems; the message is correct.

In the case B, because there are no errors in the redundance, attempts can be made to recreate the message m from the redundance r.

An explanation now follows how a message corresponding to a given redundance can be calculated:

From the expression (1), let there be multiplied on either side by $x^{12}$:

$$m(x)^x x^{23} + r(x)^x x^{12} = G(x)^x x^{12x} q(x).$$

The code being cyclic, the first term of this relation is equivalent to:

$$r(x)^x x^{12} + m(x).$$

This term therefore being a Golay code, it can be divided by a divide-by $x^{23}+1$ polynome of the $12^{th}$ degree:

$$r(x)^x x^{12} + m(x) = P(x)^x Q_2(x) = G(x)^x x^{12x} q(x) \qquad (4)$$

The first divisors by $x^{23}+1$ are: $x+1$ $$x^{11} + x^{10} + x^6 + x^5 + x^4 + x^2 + 1 = G(x).$$

$$x^{11} + x^9 + x^7 + x^6 + x^5 + x + 1 = H(x).$$

Therefore, there are two possibilities: $P(x)$ is either equal to $(x+1)^x G(x)$, or equal to $(x+1)^x H(x)$. In order to satisfy the second equality of (4), it is necessary that $G(x)$ divides either $P(x)$ or $Q_2(x)$. If $P(x) = (x+1)^x H(x)$, it cannot be divided by $G(x)$. Therefore $G(x)$ divides $Q_2(x)$ and there is: $Q_2(x) = G(x)^x Q_3(x)$. The equality (4) therefore becomes, whilst replacing $Q_2(x)$ and $P(x)$ by their values:

$$r(x)^x x^{12} + m(x) = H(x)^x (x+1)^x G(x)^x Q_3(x),$$

which is impossible because $H(x)^x(x+1)^x G(x) = x^{23} + 1 = 0$. ($x^{23}$ is equivalent to 1 because the product by $x^{23}$ corresponds to a complete circular permutation, therefore $x^{23}+1 = 1+1 = 0$, the symbol + always indicating "Exculsive OR",) therefore: $P(x) = (x+1)^x G(x)$ and $$r(x)^x x^{12} + m(x) = (x+1^x G(x)^x Q_2(x).$$

Therefore, the message can be obtained from the redundance in a manner analogous to that used to obtain the redundance from the message, the relevant polynome then being $(x+1).G(x)$.

Since the redundance comprises one bit less than the message, it can be expected that two different messages exist, which both correspond to it. If to the expression (1) is added on either side $G(x)^x x^{11}$, it follows:

$$[m(x)+G(x)]x^{11}+r(x) = G(x)[q(x)+x^{11}]$$

Therefore, if m(x) is a message coresponding to the redundance r(x), the other corresponding message is $m(x)+G(x)$, because it gives the same residue during its division by $G(x)$. In the notation usual in informatics, the polynome $G(x)$ represents a word of 12 bits, whose value in hexadecimal code is C75.

For the reconstruction of the message, use may also be made of a matrix method. A matrix specific for the method according to the invention can then be determined, which permits of retrieving the messages corresponding to different redundances. This is the matrix M of FIG. 3.

The corresponding message m will be obtained by calculating:

$$m + M^x r \qquad (5).$$

Since it is supposed that there are at most three errors and that these errors are all present in the message, the reconstructed message m corresponding to the redundance received must not differ by more than three bits from the erroneous message received. Otherwise, the other message corresponding to the redundance is tested, i.e. m+C75. If one of the two reconstructed messages corresponds to this condition, this is the message looked for.

In the case C, there is only one error in the message. This error therefore relates to one and only a single of the twelve bits of the message. Therefore, there are only twelve possible cases. In turn each bit of the message received is modified by complementing it to 1 and each time a test is carried out to know whether the correct message has been obtained. The code with a modified bit for testing will be designated as "corrected code".

If effectively the correct message has been created, the syndrome of the corrected code is r'(in the above expression (3), m' is zero if the message is corrected). Since in the case C, there are at least two errors in the redundance, this syndrome equal to r' will therefore comprise at most two "1" bits. If the correct message has not been recreated, the product $G^x m'$ contains more than three "1" bits, as already has been indicated, and the syndrome therefore contains more than three "1" bits.

In conclusion, for the case C: if the syndrome of the corrected code comprises at most two "1" bits, the modified message is correct.

The case D is treated as a combination of the cases B and C: If there is only one error in the redundance, which comprises eleven bits, there are thus eleven possible cases. Therefore, by complementation to 1, in turn each bit of the redundance received is modified. If in one of these eleven cases, the corrected code comprises a modified redundance, which does not contain any errors, the case B arises, which is treated as such. Nevertheless, in the present case D, there are at most two errors in the message (and no longer three, as in the case B), and the criterion determining the validity of each of the two messages corresponding to each modified redundance consists of its difference by at most two bits with respect to the message received.

FIG. 5 shows a flow chart of all the steps of the process described. The code received is introduced on the upper side of the Figure into a module 1, which represents the calculation of the syndrome. This syndome is used in step 2, in which the number of its "1" bits is tested. If this number is smaller than 3, which condition is designated by Y, the messge received is correct and the process is terminated. This is effected along the arrow 22. If the syndrome has more than three "1" bits, the condition designated by N is obtained and the syndrome is stored in the step 3 so that it may be used again in step 9. The step 4 corresponds to the reconstruction of the message from the redundance. In practice, as will be seen hereinafter, not the message itself, but the difference between the message corresponding to the redundance and the message really received is calculated. This difference is designated as "inverse syndrome".

This inverse syndrome is stored in step 5 so that it may be used again in step 12. In step 6, there is tested whether the inverse syndrome comprises less than three "1" bits, that is to say whether the reconstructed message differs by less than three bits from the message received. If this is verified (condition Y), the inverse syndrome is added to the message received in step 17 and the process is terminated. If this is not verified (condition N), the step 7 is reached. in which C75 (hexadecimal) is added to the inverse syndrome, whereupon in 8, 18 the same operations are carried out as in 6, 17. If the condition 8 is not realized, step 9 is reached, in which the syndrome is calculated with complentation to 1 of the first bit of the message and in step 10 there is verified whether there are at most two "1" bits. If the condition is fulfilled, the first bit of the message is complemented in step 9; otherwise, in 11 there is tested, what number of bit has been modified, and if the twelfth bit has not yet been reached, there is returned to 9, in which the syndrome is calculated with complementation of the next bit of the message, and so on, to the twelfth bit of the message. If the correct message still has not been found and the twelfth bit has been reached, the step 12 is attained, in which the first bit of the redundance is modified. In order to calculate more easily the message from the redundance, the "inverse syndrome" of step 5 is used again in a manner which will be explained below so as to deduce therefrom the inverse syndrome of the code provided with the modified redundance (designated as "modified inverse syndrome") and in step 13 there is tested whether this modified inverse syndrome comprises less than two "1" bits, in which event it is added in step 20 to the message and the process is terminated. If this is not the case, C75 is added to the modified inverse syndrome and the operations 15, 21 identical to the operations 13, 20 are attaind. If none of the two inverse syndromes is convenient, in 16 the number of the modified bit is tested (in a manner analogous to step 11) and there is returned to 12 if bits to be modified are left. If the 11$^{th}$ bit inclusive is reached without finding a satisfactory message, the termination is effected along the arrow 23, which indicates that the whole process has failed.

It is clear that this process comprises groups of steps which are mutually independent and that these groups can be inverted; the groups (1–2), (4–8), (9–11) and (12–16), respectively, can essentially be arranged in any arbitrary order. In practice, it is easier to begin with the simplest tests, which leads to the indicated order.

An apparatus for carrying out the process will now be described. In practice, the polynome divisions are realized by means of shift registers, which are fed back. FIG. 2 shows a register which comprises 11 positions and whose output is fed back at the same time to the positions 0, 2, 4, 5, 6, 10, the feedback having the effect to place in the said storage positions the result of the addition as "Exclusive OR" function of the outgoing bit with the bit initially present in the said position. It should be noted that these positions each correspond to a power of x in the generating polynome G(x), the leftmost term ($x^{11}$) being omitted. In other words, each time a bit leaves the register on the lefthand side, 49F (hexadecimal) is added to the register.

It is known that such an arrangement realizes the division of a first number $m^x x^{11} + r$ introduced in the register by a second number represented by "1" bits in the feedback positions, plus one bit on the lefthand side: there is thus divided by the number corresponding to the generating polynome G(x). The final contents of the register corresponds to the residue of the division. If an erroneous message is introduced into the register, the final contents are the residue corresponding to this erroneous message, that is to say the redundance which would have to be associated with it. Since after the message the redundance as received is introduced, these two values are added to each other, which correspond to the definition of the syndrome. At the end of the operation, the syndrome of the code is present in this register.

Of course it is possible either to use effectively a hardware shift register or to simulate the action of this register by means of a soft-ware device.

Therefore, the apparatus comprises a shift register or an equivalent digital device with a feedback from the output to the positions of the register corresponding to the terms present in the generating polynome, which permits of calculating the syndrome. In known manner, the number of "1" bits present in the syndrome is counted and if this number is smaller than three, there are no errors in the message received.

If this is not the case, there is passed to the aforementioned case B and the inverse syndrome is calculated by means of a second hardware or simulated shift register based on the same pirnciple and shown in FIG. 4, whose output is fed back to the positions of bits corresponding to the hexadecimal number 49F and which comprises twelve positions. It has appeared from the foregoing that the message can be reconstructed from the redundance by means of the generating polynome $(x+1)^x G(x)$, that is to say by means of the word obtained by multiplying C75 (that is to say G(x) expressed in hexadecimal code) by the binary number 11 (that is to say: $x+1$). The word obtained is 149F (in hexadecimal code), which has 13 bits, and, like in the preceding case, the lefthand bit is abandoned, which gives 49F with 12 bits. $r^x x^{12} + m$ is then introduced into the register of 12 bits, that is to say first the redundance, which leads to the formation of an associated message and then of the message received, which forms its difference with the associated message formed beforehand, i.e. what has been designated above as the inverse syndrome: if the redundance is correct, it comprises a number of "1" bits equal to the number of errors in the message. It is verified whether this number is smaller than 3. If this is the case, the contents of the register are added to the message to correct its errors. Otherwise, C75 is added to the inverse syndrome, as expressed above, to create the inverse syndrome of the second message, which also corresponds to the redundance, and termination is effected in the same manner.

If the syndrome still comprises more than 3 "1" bits, there is passed to the case C. Here, in practice the matrix method indicated above is set, which permits of reconstructing the corrected message words without each time repeating the complete calculation of the inverse syndrome for each examined case. From the matrix G and from the relation (2), the case is treated, in which one bit of the message should be modified. When designating by "e" correction word comprising one bit which is added to the message to correct it, the corresponding syndrome is:

$$s(m,r) = G^*(m + e) + r$$
$$= [G^*m + r] + G^*1$$

From the expression $G^x m + r$ already calculated, it therefore suffices to add $G^x e$ to obtain a new syndrome. Since e comprises only one "1" bit, the matrix product $G^x e$ is equal to the column of the matrix, whose rank-order is eaqual to that of the bit in e. In order to obtain the syndrome corresponding to the correction of each of the bits in turn, it will suffice to add each column of the matrix G in turn to the syndrome of the received code calculated before, that is to say to the contents of the shift register of FIG. 2, after it has been used for the case A (of course, it must be reset to the previous state before adding each next matrix column). For this purpose, in the process of FIG. 5, the contents of the regiser had been stored in step 3. For each modified contents of the register, the number of "1" bits is mounted and, if it is less than two, the correction word is added to the message to correct it; otherwise, there is continued to the twelfth correction word.

If at this instant, satisfaction still has not been obtained, there is passed to step D (which otherwise could also have been effected before step C). For this step, the matrix M is used in a manner analogous to the matrix G in step C. The validity of the method is demonstrated in a similar manner starting from the matrix M and from the relation (5). Therefore, one after the other the columns of the matrix M stored once for all in a memory are added to the inverse syndrome obtained in the shift register of FIG. 4 after it has been used for the case B and which had been stored in step 5 of FIG. 5. Each time the number of "1" bits of the register is counted; if there are at most two of them, this register is added to the message; otherwise, C75 is added thereto, as in the case B, and the "1" bits are counted, and so on, to the eleventh column of the matrix M.

If in one of the cases a solution is reached, the message contains more than three errors.

The apparatus associated with the method has the advantage that it is rapid and also utilizes little storge capacity; it only utilizes a few tens of octets, whereas the storage of all the possible errors would require 6K octets for three octets of length of the code multiplied by the 2048 possible cases.

What is claimed is:

1. A method of correcting in a television receiver errors in a number less than four in digital data received with the television signal and coded according to a cylic so-called Golay code comprising a word of 12 bits representing a message and a word of 11 bits which is the residue of the Euclidian division of the message by a word designated as "generating polynome", and which provides for a redundance, in which there is started to establish from the code as received a particular word designated as "syndrome", which represents the difference between the redundance as received and that which would have to correspond to the message received, and permits of affirming that the message does not contain errors if the syndrome comprises at most three "1" bits, that is to say that it differs by at most three bits from that which would be obtained in the absence of errors, characterized in that, if the syndrome comprises more than three bits, a series of operations are carried out, each of which can provide the solution, in which event the following operations are not carried out, and which consists of the following tests:

from the redundance word received, for which there are two corresponding messages capable of forming with it a correct code, it is determined for each of the two corresponding message words whether it differs by more than three bits from the message word received, in which event this corresponding word is the correct one;

each of the twelve bits of the message word received is modified in turn and each time it is determined whether the syndrome of the complete code received provided with the modified message comprises more than two bits, in which event the modified message word received is the correct one;

each of the bits of the redundance word received is modified in turn and it is determined each time by each of the two corresponding message words whether it differs by more than two bits from the message word received, in which event this corresponding message word is the correct one.

2. An apparatus for carrying out the method claimed in claim 1, characterized in that it comprises for the calculation of the syndrome a shift register or an equivalent digital device with a feedback from the output to the positions of the register corresponding to the terms present in the generating polynome, the feedback having the effect to place in the said positions the result of the addition as "exclusive OR" function of the outgoing bit with the bit initially present in the said position.

3. An apparatus for carrying out the method claimed in claim 1, characterized in that it comprises the calculation of the inverse syndrome, i.e. of the difference between the message that has been received and a message corresponding to the redundance that has been received, a shift register or an equivalent digital device with a feedback to the positions of bits corresponding to the hexadecimal number 49F.

4. An apparatus as claimed in claim 2, characterized in that it comprises for the calculation of the syndromes of the corrected codes a memory, in wyich words are stored each corresponding to a column of a matrix (G) generating the redundance from the message and a device for adding in turn each of the said words to the contents of the shift register.

5. An apparatus as claimed in claim 3, characterized in that it comprises for the calculation of the inverse syndromes of the corrected codes a memory, in which words are stored each corresponding to a column of a matrix (M) generating the message from the redundance and a device for adding in turn each of the said words to the contents of the shift register.

* * * * *